United States Patent
Beck et al.

(10) Patent No.: US 10,338,176 B2
(45) Date of Patent: Jul. 2, 2019

(54) METHOD AND APPARATUS FOR ACTUATION OF A MAGNETIC RESONANCE SCANNER FOR THE SIMULTANEOUS ACQUISITION OF MULTIPLE SLICES

(71) Applicant: Siemens Healthcare GmbH, Erlangen (DE)

(72) Inventors: Thomas Beck, Erlangen (DE); Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 253 days.

(21) Appl. No.: 15/356,182

(22) Filed: Nov. 18, 2016

(65) Prior Publication Data

US 2017/0146625 A1 May 25, 2017

(30) Foreign Application Priority Data

Nov. 19, 2015 (DE) .......................... 10 2015 222 833

(51) Int. Cl.
  *G01R 33/483* (2006.01)
  *G01R 33/48* (2006.01)
  *G01R 33/54* (2006.01)

(52) U.S. Cl.
  CPC ..... *G01R 33/4835* (2013.01); *G01R 33/4828* (2013.01); *G01R 33/543* (2013.01)

(58) Field of Classification Search
  None
  See application file for complete search history.

(56) References Cited

U.S. PATENT DOCUMENTS

| | | | |
|---|---|---|---|
| 2011/0210733 A1* | 9/2011 | Wheaton | G01R 33/5607 324/309 |
| 2013/0057280 A1 | 3/2013 | Feiweier | |
| 2013/0057281 A1 | 3/2013 | Feiweier | |
| 2013/0342206 A1 | 12/2013 | Ugurbil | |
| 2014/0253120 A1 | 9/2014 | Ugurbil et al. | |
| 2015/0084627 A1* | 3/2015 | Ruhm | A61B 5/055 324/309 |
| 2015/0260820 A1 | 9/2015 | Speier | |
| 2015/0302297 A1 | 10/2015 | Griswold et al. | |
| 2016/0341807 A1* | 11/2016 | Bilgic | G01R 33/4835 |

OTHER PUBLICATIONS

Ma et al., "Magnetic resonance fingerprinting," Nature, vol. 495, Nr. 7440, pp. 187-192 (2011).
Norris et al., "Power Independent of Number of Slices (PINS) Radiofrequency Pulses for Low-Power Simultaneous Multislice Excitation," Magnetic Resonance in Medicine, vol. 60, pp. 1234-1240 (2011).

(Continued)

Primary Examiner — Douglas X Rodriguez
(74) Attorney, Agent, or Firm — Schiff Hardin LLP

(57) ABSTRACT

In a method and a magnetic resonance imaging system to generate magnetic resonance image data of an object, during the acquisition of magnetic resonance raw data, different transverse magnetizations are excited in multiple sub-volumes to be depicted and used for imaging. These different transverse magnetizations are simultaneously present in at least one time interval of the measurement. Image data are reconstructed from the acquired raw data.

18 Claims, 8 Drawing Sheets

(56) References Cited

OTHER PUBLICATIONS

Breuer et al., "Controlled Aliasing in Parallel Imaging Results in Higher Acceleration (CAIPIRINHA) for Multi-Slice Imaging," Magnetic Resonance in Medicine, vol. 53, pp. 684-691 (2005).
Bhat et al., "Motion Insensitive ACS Acquisition Method for in-plane and Simultaneous Multi-Slice Accelerated EPI," Proc. Intl. Soc. Mag. Reson. Med., vol. 22, p. 0644 (2014).
Stäb et al., "CAIPIRINHA Accelerated SSFP Imaging," Magnetic Resonance in Medicine, vol. 65, pp. 157-164 (2011).
Auerbach et al., "Multiband Accelerated Spin-Echo Echo Planar Imaging with Reduced Peak RF Power Using Time-Shifted RF Pulses," Magnetic Resonance in Medicine, vol. 69, pp. 1261-1267 (2013).
Griswold et al., "Generalized Autocalibrating Partially Parallel Acquisitions (GRAPPA)," Magnetic Resonance in Medicine, vol. 47, pp. 1202-1210 (2002).
Souza et al., "SIMA: Simultaneous Multislice Acquisition of MR Images by Hadamard-Encoded Excitation," Journal of Computer Assisted Tomography, vol. 12, Nr. 6, pp. 1026-1030 (1988).
Zahneisen et al., "Simultaneous Multi-Slice fMRI using Spiral Trajectories," Neuroimage, vol. 92, pp. 8-18 (2014).
Setsompop et al., "Blipped-Controlled Aliasing in Parallel Imaging for Simultaneous Multislice Echo Planar Imaging With Reduced g-Factor Penalty," Magnetic Resonance in Medicine, vol. 67, pp. 1210-1224 (2012).
Larkman et al., "Use of Multicoil Arrays for Separation of Signal from Multiple Slices Simultaneously Excited," Journal of Magnetic Resonance Imaging, vol. 13, pp. 313-317 (2001).
Eichner et al. "Slice Accelerated Gradient-Echo Spin-Echo Dynamic Susceptibility Contrast Imaging with Blipped CAIPI for Increased Slice Coverage"; In: Magnetic Resonance in Medicine; vol. 72, pp. 770-778 (2014).

\* cited by examiner

METHOD AND APPARATUS FOR ACTUATION OF A MAGNETIC RESONANCE SCANNER FOR THE SIMULTANEOUS ACQUISITION OF MULTIPLE SLICES

BACKGROUND OF THE INVENTION

Field of the Invention

The invention concerns a method for the actuation of a magnetic resonance imaging scanner for the generation of magnetic resonance image data of an object under examination from whom magnetic resonance raw data are acquired. The invention also relates to an actuation-sequence-determining system. The invention also relates to a magnetic resonance imaging system.

Description of the Prior Art

Modern imaging methods are frequently used to generate two-dimensional or three-dimensional image data, or a time series of image data, which can be used for the visualization of an object under examination. Imaging systems based on magnetic resonance imaging, called magnetic resonance tomography systems, have been successfully established and proven in a multitude of applications. With this type of imaging, generally a static basic magnetic field $B_0$, which is used for initial alignment and homogenization of magnetic dipoles (nuclear spins) to be examined, is superimposed with a rapidly switched magnetic field, called a gradient field, for spatial resolution of the imaging signal. To determine the material properties of an object under examination to be imaged, the dephasing or relaxation time after a deflection of the magnetization out of the initial direction of alignment is determined so that different relaxation mechanisms or relaxation times typical of the material can be identified. The deflection generally takes places by the radiation of a number of RF pulses and, in this case, the spatial resolution is based on a temporally established manipulation of the deflected manipulation of the deflected magnetization with the use of the gradient field in a so measurement sequence or actuation sequence such a sequence defines a precise chronological sequence of RF pulses, the activation of the gradient field (by a switching sequence of gradient pulses) and the acquisition of measurement values. In addition to relaxation, there are other attributes of the nuclear spins that can be detected such as flux measurement and diffusion detection (diffusion imaging).

An association between the measured (detected) magnetization—from which the aforementioned material properties can be derived—and a spatial coordinate of the measured magnetization in the three-dimensional space in which the object under examination is situated, typically takes place with the use of an intermediate step. In this intermediate step, acquired raw magnetic resonance data are entered at readout points in a memory, thereby resulting in a data set known as "k-space". This entry of data into the k-space memory at respective data entry points is also called "sampling" k-space. The coordinates of the k-space data are encoded as a function of the gradient field. The magnitude of the magnetization (in particular the transverse magnetization determined in a plane transverse to the above-described basic magnetic field) at a specific location of the object under examination can be determined from the k-space data with the use of a Fourier transformation. In other words, the k-space data (magnitude and phase) are required to calculate a signal strength of the signal, and optionally its phase, in three-dimensional space.

Magnetic resonance tomography is a relatively slow type of imaging method because the data are recorded sequentially along trajectories such as, for example, lines or spirals in the Fourier space or k-space. The method for recording images in two-dimensional slices is much less susceptible to errors than recording in three dimensions, because there are fewer encoding steps than with a three-dimensional method. As a result, in many applications, image volumes with stacks of two-dimensional slices are used instead of a single three-dimensional recording. However, due to the long relaxation times of the spins, the imaging times are very long and this, impairs the comfort of a patient to be examined. In addition, during the data recording, patients are not able to leave the magnetic resonance tomography system briefly or even to change their position because a change in position of the patient while data are being acquired would render the imaging process useless, and the entire process would have to be restarted from the beginning. Consequently, an important need is to accelerate the recording of two-dimensional slice stacks.

With another sampling method, selectively excited subvolumes or part-volumes, so-called "slabs", are spatially encoded with the use of a three-dimensional sampling method. Once again, there is a need to accelerate the recording speed with this method.

Methods for the acceleration of imaging include, for example parallel imaging techniques. With these known technologies, known by the names "simultaneous multi-slice" (SMS imaging), "slice acceleration" or even "multi-band", numerous slices are excited and read-out simultaneously (see, for example, Breuer et al. MRM 53:684 (2005), Souza et al. JCAT 12:1026 (1988), Larkman et al. JMRI 13:313 (2001), (MRM=Magnetic Resonance in Medicine, JCAT=Journal of Computer Assisted Tomography, JMRI=Journal of Magnetic Resonance Imaging)). For example, with an acceleration factor of 3, in each case, 3 slices are excited and read-out simultaneously. This reduces the required repetition time TR (repetition time TR=time until successive pulse sequences are applied to the same slice) to ⅓ of the required time. Advantageously, these methods reduce the measuring time and/or increase the temporal sampling rate.

There is also a possibility of using "multi-slab" imaging to sample several subvolumes simultaneously in order to accelerate the recording process when sampling selectively excited subvolumes. A procedure of this kind can be considered to be an intermediate stage between 2D multi-slice imaging and complete 3D imaging.

Depending upon the pulse sequence of the sequence to be accelerated, it is not automatically possible to apply all pulses to a number of slices simultaneously without, for example, exceeding SAR thresholds (SAR=specific absorption rate=measure for the absorption of electromagnetic fields in a material) or the available peak power of the RF amplifier. This restriction affects, for example, excitation pulses, i.e. RF pulses, with which spins are manipulated, for example excited or refocused in a specific region of the object under examination a) with high flip angles, such as, for example, 180° refocusing pulses in the TSE sequence (TSE=turbo spin-echo) or b) with a high bandwidth, as with spectrally selective excitations or rapid gradient-echo sequences.

In the case of applications in the ultrahigh field range, for example 3 T and higher, in particular 7 T and higher, physiological limits (SAR stress) and/or technical limits (RF peak power) are reached very easily.

If, for example, imaging is initially performed with simultaneous excitation of a number of slices with a first flip angle $\alpha_1$ for all slices, and then further simultaneous excitation is performed with a second flip angle $\alpha_2$ with another value for all slices, this has the drawback that for the MR imaging with the higher flip angle, both the SAR stress and the required RF peak power would be higher by the factor N of the number of simultaneously excited slices. This steep increase means stress and power thresholds are easily exceeded in the case of SMS measurements.

A further problem with SMS imaging relates to the chronological consistency of image data with different contrasts. In the prior art, the spins in the multiple simultaneously excited slices undergo the same contrast evolution. However, if images with different contrast evolutions are required for the diagnosis, these images are conventionally recorded in succession in individual measurements. Although, with simultaneous multi-slice methods, the recording duration of the individual measurement is reduced, there is usually a time interval, which can be as much as several minutes, between the measurements. During this time interval, changes often occur, in particular movements, in the region to be examined. Hence, the assignment of image information between the different contrasts requires complex and error-prone registration methods. A similar problem also occurs if different sequence types are to be applied for different slices. For this application, once again conventionally different sequences are activation in temporal succession.

One possibility for adhering to SAR thresholds is to limit the permitted acceleration factors and hence the number of slices to be read-out simultaneously such that the SAR thresholds or the available RF peak power are not exceeded. However, in many scenarios, it is no longer possible to achieve acceleration factors of 2. Alternatively thereto, there are approaches that, for example, shift the excitation pulses slightly relative to one another in time in order to reduce constructive interference to the excitation pulses. For example, DE 10 2011 082 010 B4 and later Auerbach et al. MRM 69:1261 (2013) suggest a method for a time delay between the application of RF excitations of individual bands. This results in hardly any increase in the required peak power compared to non-accelerated pulses. With this application, the excitation pulses in the individual slices do not differ. Hence, the identical pulse (with the identical flip angle) is slightly time-delayed at another position. However, the latter instance represents a restriction of the method since both slices initially undergo slightly different dephasing, which has to be taken into account by suitable compensation measures (for example considered during the application of a refocusing pulse).

Norris et al. MRM 66:1234 (2011) suggests an approach known as PINS ("power independent of number of slices") in order to limit the SAR exposure. This approach is based on convolution of the excitation pulse with a Dirac comb function. This achieves a periodic repetition of the slice profile, wherein, however, the SAR exposure is independent of the number of excited slices and greatly reduced compared to the standard simultaneous multi-slice approach. One drawback of this technique is that the recurring excitation pattern continues ad infinitum and hence, depending upon the positioning of the image volume, (unwanted) more remote anatomical structures are also excited. In addition, a prolongation of the RF pulse duration should be expected with the practical application of this method.

SUMMARY OF THE INVENTION

An object of the present invention is to provide a rapid magnetic resonance imaging method with which lower SAR stress can be achieved and images with different contrasts can be recorded with higher precision and a lower amount of post-editing work.

In the method according to the invention for actuation of a magnetic resonance data acquisition scanner for the generation of magnetic resonance image data of an object under examination, magnetic resonance raw data are acquired, with different transverse magnetizations being excited in N partial volumes to be depicted and used for imaging. N partial volumes to be depicted means different slices or the aforementioned partial volumes described as "slabs". In this case, these different transverse magnetizations are present simultaneously at least in one time interval of the measurement. In this case, transverse magnetization should be understood to mean magnetization oriented in the transverse direction to the basic magnetic field. Therefore, if different transverse magnetizations are read out from a number of partial volumes to be depicted simultaneously, it is possible to record images with different contrasts at the same time. A procedure of this kind not only saves time compared to the conventional procedure, it also enables the avoidance of cumbersome post-editing of images with different contrasts of objects that have moved. This is because, contrary to conventional sequential methods, measurement data with different contrasts are acquired simultaneously.

The actuation sequence according to the invention for the actuation of a magnetic resonance imaging system has at least one pulse sequence section with an excitation section. The excitation section includes the following pulse arrangement: at least one slice selection gradient pulse in the slice selection direction, at least one RF excitation pulse to influence N partial volumes to be depicted simultaneously such that the magnetization state of at least a part of the plurality of N partial volumes to be depicted simultaneously and influenced by a further imaging parameter that does not relate to the selection of the individual partial volumes differs. The selection of the imaging parameters relating to the individual partial volumes can be the excitation frequency or the relative phase with which the partial volumes in questions are excited. The actuation sequence also has a readout section having a readout window for reading-out RF signals for the acquisition of magnetic resonance raw data. A slice selection gradient means a magnetic field gradient with which a magnetic field which is spatially dependent in one direction is imposed on individual partial volumes, for example slices or "slabs". Different magnetic field strengths are assigned to different slices so that an RF excitation pulse emitted simultaneously with the slice selection gradient pulse only acts on the selected slice or the selected partial volume.

Further imaging parameters should be understood to be values that influence the image contrast of the MR imaging. The pulse sequence section can also have a number of gradient pulses in the slice selection direction. In this context, the use of the indefinite article should not be understood as being restrictive. A pulse sequence should, as usual in magnetic resonance tomography, be understood to mean a sequence of radio-frequency pulses and magnetic field gradient shifts of different strengths and durations with which a nuclear magnetic resonance signal is generated. On the basis of the basic concept, a pulse sequence section should be understood to be a multi-repeated section of the pulse sequence, wherein modifications can be made on each repetition, for example with respect to the gradient shifts.

The method according to the invention enables MR images with different contrasts to be recorded simultaneously. In this case, it is implicitly ensured that the images recorded with the different contrasts images are registered as optimally as possible, i.e. consistently with respect to their spatial information.

In addition, due to an averaging effect over the different imaging parameters, simultaneous images with different imaging parameters enable the achievement of lower SAR stresses and lower RF peak powers than is the case with conventional simultaneous imaging procedures.

The actuation-sequence-determining computer according to the invention is configured to determine the actuation sequence according to the invention.

The magnetic resonance imaging computer according to the invention has a processor configured to control the magnetic resonance scanner using the method according to the invention.

The basic components of the processor of the magnetic resonance imaging computer according to the invention can be predominantly embodied in the form of software components. However, especially when particularly rapid calculations are involved, these components can be partially implemented in the form of software-supported hardware, for example FPGAs or the like. Similarly, for example if only a transfer of data from other software components is involved, the required interfaces can be embodied as software interfaces. However, they can also be embodied as hardware interfaces that are actuated by suitable software.

The processor according to the invention can be part of a user terminal or a control computer of an MR system.

A largely software-based implementation has the advantage that control procedures that have been used to date can be easily be upgraded by a software update in order to operate in the manner according to the invention. In this respect, the above object is also achieved by a non-transitory, computer-readable data storage medium encoded with programming instructions. The storage medium can be loaded directly into a memory of a control computer of a magnetic resonance tomography system, and the programming instructions cause all steps of the method according to the invention to be implemented when the programming code is executed in the control computer. The computer can optionally have additional components, such as documentation code and/or additional components including hardware components, such as hardware keys (dongles etc.) for using the software.

The computer-readable medium can be, for example a memory stick, a hard disk or any other transportable or built-in data medium.

The different features of different exemplary embodiments can be combined to form further exemplary embodiments.

In an embodiment of the method according to the invention, at least one pulse sequence section is generated for the actuation of the magnetic resonance imaging apparatus (i.e., the scanner thereof). The pulse sequence section has an excitation process and a readout process. With the excitation process, a slice selection gradient pulse is generated in the slice selection direction. As mentioned above, it is also possible for a number of slice selection gradient pulses to be activated. For example, each slice can be assigned its own slice selection gradient. However, it is also possible for common slice-selection gradients to be activated for a number of slices. The slices can be simultaneously excited or they can alternatively be excited in temporal succession one after the other.

One possible excitation process can be, for example, for a single RF pulse to excite N partial volumes, preferably N slices, simultaneously. Alternatively, it is also possible for a number of RF pulses to excite N partial volumes, preferably N slices, in sequence. However, it is also possible for any mixtures of the two above-described procedures to be applied. A first RF pulse can excite K partial volumes, preferably K slices, a second RF pulse can excite L partial volumes, preferably L slices, and a third RF pulses can excite M partial volumes, preferably M slices, etc., wherein K+L+M+ . . . =N and K, L, M, N are whole numbers. In the introduction, for example, a method was suggested for a time delay between the application of RF excitations of individual bands. For example, this can be combined with the method according to the invention, thus further reducing the SAR stress.

Furthermore, within the context of the excitation process, different transverse magnetizations are generated by radiating at least one RF excitation pulse in order to influence N partial volumes to be depicted simultaneously, preferably N slices to be depicted simultaneously. This takes place such that the magnetization state of the N partial volumes to be depicted simultaneously and influenced by a further imaging parameter relating to neither the excitation frequency nor the excitation phase differs. During the subsequent readout process, one or more common readout gradient pulses for the N partial volumes to be depicted simultaneously and influenced by the irradiation of RF pulses are generated. Finally, in the context of the readout process, RF signals for the acquisition of magnetic resonance raw data are received.

In a preferred embodiment of the method according to the invention, the further imaging parameters that are selected so as to be different comprise at least one of the following values:
amplitude value,
amplitude curve,
starting point and duration,
number of RF pulses,
sequence type.

With the method according to the invention, for the generation of different transverse magnetizations, preferably refocusing pulses are only activated for a part of the N partial volumes to be excited simultaneously. When RF refocusing pulses are only applied to part of the partial volumes or slices, it possible to achieve a reduction in SAR stress and the RF peak power, in particular when slices that are read out simultaneously that are not occupied with refocusing pulses are excited with a time offset with respect to the refocusing pulses.

In a particularly practicable variant of the method according to the invention, for at least a part of the N partial volumes, for example slices, the parameters that are selected so as to be different are used to generate excitations with different flip angles. As mentioned above, with conventional simultaneous imaging, the SAR stress and the RF peak power are higher by the factor N compared to single-slice imaging with the greatest flip angle $\alpha_{max}$, wherein N is the number of simultaneously read-out partial volumes. Moreover, with the method according to the invention, the value of the increase in these stresses relative to the imaging with the greatest flip angle with M different flip angles is only $N/M*(\alpha_1+\alpha_2+ \ldots \alpha_M)/\alpha_{max}$. Thus, in the case of two different flip angles, a value of $N/2(\alpha_1+\alpha_2)/2$ is obtained.

If, for example, two image contrasts are generated with a first flip angle $\alpha_1=10°$ and a second flip angle $\alpha_1=60°$ and N=2 slices are simultaneously excited, with a conventional procedure, during the measurement with the greater flip angle, the object under examination would be exposed to twice the SAR stress and the magnetic resonance imaging system to twice the RF peak power. On the other hand, with the method according to the invention, during the measurement with the greater flip angle, compared to single-slice measurement, only one stress increased by the factor $(10°+60°)/60°≈1.2$ is achieved. Therefore, compared to simultaneous imaging with identical flip angles, simultaneous imaging of a plurality of slices with different flip angles achieves a significant reduction in SAR stress.

Particularly preferably, excitations with different pulse sequences, preferably spin-echo sequences and/or gradient-echo sequences, are generated for at least a part of the N partial volumes, for example slices. Therefore, pulse sequences with different sequence types are activated simultaneously. A procedure of this kind can achieve, for example, a time advantage since different contrasts can be recorded simultaneously. One particular advantage is obtained with the application of spin-echo sequences since these are not particularly suitable for a conventional simultaneous multi-slice measurement. With spin-echo sequences, refocusing pulses are used that are constructively superimposed during the simultaneous application of a plurality of refocusing pulses to adjacent partial volumes so that the SAR stress and the RF peak power are greatly increased. However, if, during the simultaneous measurements, another sequence type without a refocusing pulse is used for partial volumes to be depicted simultaneously, it is possible to avoid this constructive superimposition.

A reduction in the SAR stress and the RF peak stress can be achieved in that the refocusing pulse in the spin-echo sequence and a RF excitation pulse in the simultaneously used gradient-echo sequence are activated not exactly simultaneously but with a slight time offset so that the RF excitation pulse and the refocusing pulse are not constructively superimposed.

In a further embodiments of the method according to the invention, permutation of the assignment of positions of partial volumes, for example slice positions, and imaging parameters, has the result that, for different excitations, the entire volume, for example the entire slice stack, of the partial volumes to be simultaneously recorded is acquired as an image with all imaging parameters to be measured. In this way, all partial volumes of a total volume, for example all slices of a slice stack, are acquired for different image contrasts. With a procedure of this kind, the simultaneously depicted partial volumes, for example slice stack, are depicted repeatedly in a plurality of passes, wherein the aforementioned permutations are performed. This makes it possible for each configuration with respect to the different imaging parameters to be taken into account for each partial volume to be depicted. For example, it is therefore possible to use different contrast preparations, sequence types or selective excitations for each partial volume. This procedure generates a number of images with different imaging parameters simultaneously from a region to be examined. In this case, the measuring time is advantageously only slightly increased compared to a non-accelerated single-slice measurement, in particular in the case of a number of images in a dynamic process as a result of one single reference scan performed in advance. In addition, due to the simultaneous imaging, the co-registration of the image data generally required during the sequential acquisition of different contrasts is not necessary or at least greatly simplified.

In another embodiment of the method according to the invention, it is possible for MR fingerprinting to be performed for different, simultaneously recorded partial volumes.

During the fingerprinting, which is, for example, described in Dan Ma et al. Nature 495:187 (2013), a large amount raw data is recorded from one slice or a number of slices successively in a very fast sequence and with different flip angles and repetition times in each case. The different flip angles used during the fingerprinting lie within a wide range from for example 30° to 80°. Such measurements are very time-consuming due to the large amount of measurement information to be recorded. Therefore, simultaneous multi-slice recording is, in principle, suitable. If this is performed in the conventional manner sequentially with different flip angles, it gives rise to the above-described problem that the SAR stress and the RF peak power are increased by the factor N of the slices to be simultaneously recorded. For this reason, in particular in the ultra-high field range, this special method can only be used for conventional simultaneous multi-slice measurements with extreme restrictions. With the simultaneous application of different imaging parameters for different simultaneously excited slices according to the invention, it is possible to achieve a type of complementary effect so that the SAR stress and the RF peak power are much lower than is conventionally the case.

For example, the choice of a different sequence of different flip angles for simultaneously excited slices in each case can ensure that excitation with a large flip angle in one slice is complemented by excitation with a small flip angle. This enables the SAR stress and the RF peak power to be reduced compared to a conventional simultaneous multi-slice measurement.

The reference tables required for the image reconstruction during the fingerprinting have to be suitably adapted to the use of different imaging parameters for simultaneously excited slices.

Alternatively, it is also possible to use a binomial pulse for a part of the N partial volumes, preferably slices, to be excited to excite a part of the partial volumes in a chemically selective manner or a number of different binomial pulses to excite different groups of the N partial volumes differently in a chemically selective manner.

In one special variant of the method according to the invention, a contrast preparation is used for a part of the N partial volumes, preferably slices, to be excited or different contrast preparations are used for different groups of the N partial volumes. Contrast preparations are, for example, used to suppress material components in a region to be examined that cause interference during the imaging. One important example is fat saturation, wherein, during the imaging, the possibility of signals from fat molecules impairing the imaging of other structures is avoided. A further example is inversion preparations, with which material components with specific T1 relaxation times can be suppressed. For example, this enables signal components of fluids or, once again, of fat molecules to be reduced. Another example is the T2 preparation with which an intrinsic increase in the contrast between the object to be depicted and its environment is achieved. Therefore, this variant of the method according to the invention not only enables the simultaneous generation of a plurality of images with different contrast properties—the individual images can also be provided with individual preparations for the purposes of contrast optimization. This achieves a particularly adaptable and time-saving imaging method with high image quality.

In another embodiment, with which a permutation of the simultaneous imaging of partial volumes, in particular slices, and the imaging parameters used thereby or desired target contrasts is performed, a reference measurement can be performed for at least a part of the target contrasts, i.e. a part of the different transverse magnetizations. Then, convolution matrices are calculated using a permutated combination of the individual reference measurements, wherein an adaptation of the calculation of the convolution matrices is achieved in that specific convolution kernels or convolution matrices are calculated for at least a part of the permutations of the target contrasts or the sequence of partial volumes. The calculation of convolution kernels is used to obtain a database for the evaluation of the measurement data of the actual imaging with which enables simultaneously acquired measurement data to be separated and assigned to different partial volumes, in particular slices, and contrasts so that finally a number of separate images with different contrast properties can be generated on the basis of an SMS measurement.

DESCRIPTION OF THE PREFERRED EMBODIMENTS

Figure 1:
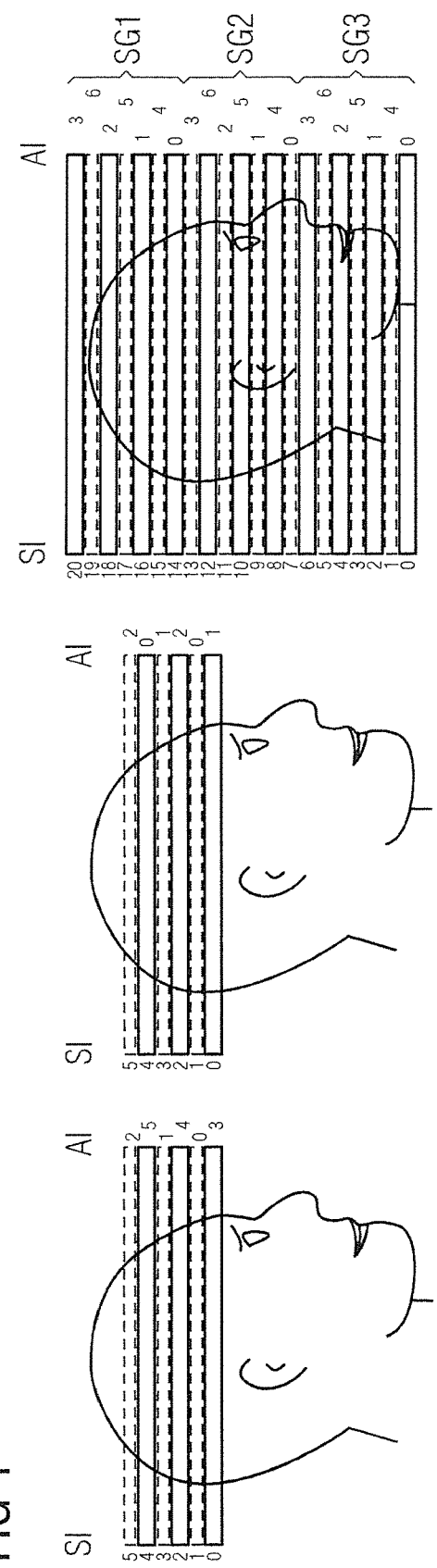
FIG. 1 schematically illustrates a simultaneous multi-slice image acquisition.

In FIG. 1 shows three diagrams illustrating an acquisition scheme for simultaneous multi-slice imaging (SMS). The left diagram shows an acquisition scheme for a MR-magnetic resonance imaging method with single-slice recording. This depicts a non-accelerated measurement with 6 interleaved recordings of slices. In the case of echo-planar imaging this requires 6 slice excitations and 6 readout cycles. The left side of the left diagram is a slice index SI of a respective slice. In this case, the slice index SI goes from 0 to 5. The right side of the left diagram shows acquisition indices AI. These indicate the sequence in which each slice is excited and read-out. The left diagram shows an interleaved excitation of single slices, i.e., the slices are excited and read-out in the sequence 1, 3, 5, 0, 2, 4.

In the middle diagram, once again 6 slices are recorded but with an accelerated SMS imaging procedure with the acceleration factor 2. I.e., 2 slices are always excited and also read out simultaneously. Hence, this imaging procedure only requires 3 excitation-and-readout cycles for the acquisition. This is also indicated with the acquisition indices AI shown at the right edge, in this case only 0 to 2. The slices 1 and 4 are recorded in a first excitation-and-readout cycle, the slices 0 and 3 are recorded in a second cycle and the slices 2 and 5 are recorded in a third cycle.

The right diagram shows the imaging of 21 slices using an accelerated SMS imaging method with the acceleration factor 3. I.e., 3 slices are always excited and also read-out simultaneously. Hence, with this imaging procedure only 7 excitation-and-readout cycles are required for the acquisition. This is also shown by the acquisition indices AI depicted at the right side, which in this case only go from 0 to 6. The simultaneously read-out slices in each case belong to one of the slice groups SG1, SG2, SG3. I.e., one slice is read-out simultaneously from each of the three slice groups SG1, SG2, SG3. The slices 0, 7 and 14 are recorded in a first excitation-and-readout cycle, the slices 2, 9 and 16 are recorded in a second cycle and the slices 4, 11 and 18 are recorded in a third cycle. The slices 6, 13 and 20 are recorded in a fourth excitation-and-readout cycle, the slices 1, 8 and 15 are recorded in a fifth cycle and the slices 3, 10 and 17 are recorded in a sixth cycle. Finally, the remaining slices 5, 12 and 19 are recorded in a seventh cycle.

Figure 2:
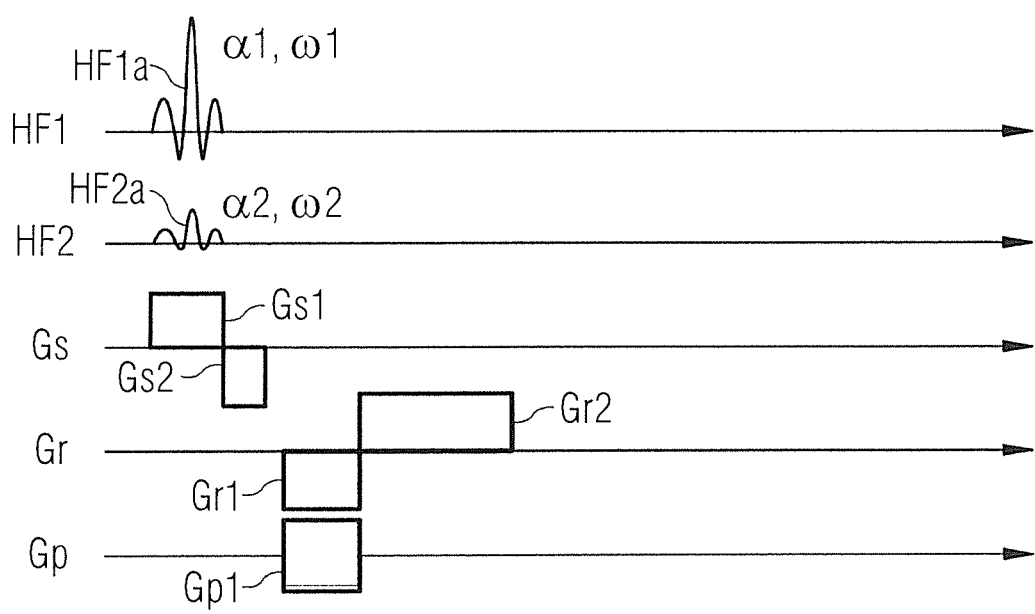
FIG. 2 shows the temporal course of an SMS pulse sequence according to a first exemplary embodiment of the invention.

FIG. 2 depicts the temporal course of an SMS pulse sequence according to a first exemplary embodiment of the invention. In the exemplary embodiment shown in FIG. 2, the number of the simultaneously excited and read-out slices is restricted to 2. However, this is only for the purpose of better elucidation. Obviously, the method according to the invention can also be used to excite and read out more than two slices simultaneously. In addition, when sampling a region to be examined, there is a repetition of an excitation with the pulse sequence shown, wherein, however, the parameters of the excitation pulses and gradients are changed. For purposes of simplicity, this repetition is not shown in FIG. 2.

In FIG. 2, the first line HF1 shows a first RF excitation pulse HF1a with a frequency offset $\omega_1$ and a flip angle $\alpha_1$. The second line HF2 shows a second RF excitation pulse HF2a with a frequency offset $\omega_2$ different from the frequency offset $\omega_1$ of the first RF excitation pulse HF1a and a flip angle $\alpha_2$ different from the flip angle $\alpha_1$. Simultaneously to the first RF excitation pulse HF1a, the second RF excitation pulse HF2a excites slice different to that excited by the first RF excitation pulse HF1a. The third line Gs shows a slice selection gradient Gs1 (followed by a further gradient Gs2). Together with the amplitude of the slice-selection gradient GS1, the frequency offsets $\omega_1$, $\omega_2$ of the RF excitation pulses HF1a, HF2a determine the position of the excited slices. The fourth line Gr identifies two frequency-encoding gradients Gr1, Gr2 and the fifth line Gp depicts a phase-encoding gradient Gp1. The frequency-encoding gradients Gr1, Gr2 and the phase-encoding gradients Gp1 are used to sample the k-space for the two slices selected with the slice selection gradient Gs1. The acquired raw data or reconstructed image data in the two slices are then separated in an evaluation step on the basis of the spatial sensitivity profiles of the reception coils, using, for example, the GRAPPA method, which is generally known, or the SENSE method. Then (in the case of the GRAPPA method), further image reconstruction of the separated raw data is performed in the manner described in the introduction.

The fact that spins with different flip angles are excited for the two slices means that two images with different contrast properties are recorded simultaneously. In the case of a gradient echo with given material parameters, i.e. longitudinal relaxation T1, transverse relaxation T2(*) and proton density PD, the relationship between the excitation of the flip angle $\alpha_i$ and the image intensity S and further parameters such as the echo time TE and the repetition time TR is obtained as:

$$S = PD \cdot \frac{1 - e^{\frac{TR}{T1}}}{\left(1 - e^{\frac{TR}{T1} \cdot \cos\alpha_i}\right) \cdot e^{\frac{TE}{T2(*)}}} \quad (1)$$

Therefore, in the case of excitation with different flip angles $\alpha_i$, different slices have different image intensity values S and hence also different contrast values. Thus, it is possible to record two images with different contrasts simultaneously from one region to be depicted of an object to be examined. This achieves a shorter total recording time compared to the recording of images with different contrasts one after the other. Moreover, in particular if an object has moved, there is no need for the additional registration of the images with a different contrast because the simultaneously recorded images with different contrast are as consistent as possible with respect to their spatial information since they were recorded simultaneously. The permutation of slice positions and flip angles $\alpha_i$ also has the result that the entire slice stack is recorded for both the desired contrasts.

In some circumstances, the method illustrated in FIG. 2 requires an additional adaptation during the step of the separation of the image data. It can be necessary to adapt the separation of the simultaneously measured slice information to different imaging parameters. This is illustrated in FIGS. 3 and 4.

The separation of simultaneously measured slices can be performed, for example, as suggested by Stäb et al. MRM 65:157 (2011). The suggested method includes the use of the GRAPPA technique described by Griswold et al. MRM (2002) for the separation of simultaneously excited slices which are shifted with respect to one another by means of the CAIPIRINHA technique of Breuer et al. MRM 53:684-691 (2005). To this end, the volume to be depicted is measured within the context of a reference scan (before carrying out the imaging pulse sequence). In this context, for example a complete volume is measured sequentially with identical protocol parameters without the use of SMS acceleration. The signal that would be expected during the simultaneous excitation of a plurality of slices is artificially generated from this reference data.

However, the protocol parameters do not have to be identical. On the contrary, it is possible to select suitable sequences that can be acquired quickly and have advantageous properties (for example are robust with respect to movement). This procedure is described in Bhat et al., ISMRM 22 (2014) (ISMRM=International Society for Magnetic Resonance in Medicine).

Figure 3:
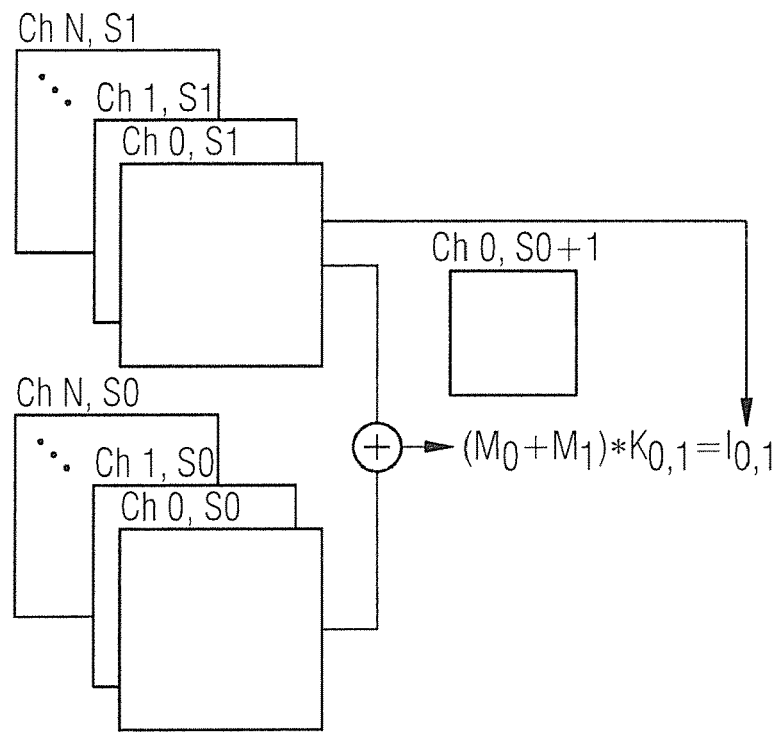
FIG. 3 illustrates the calculation of convolution kernels in the context of a reference measurement.
Figure 4:
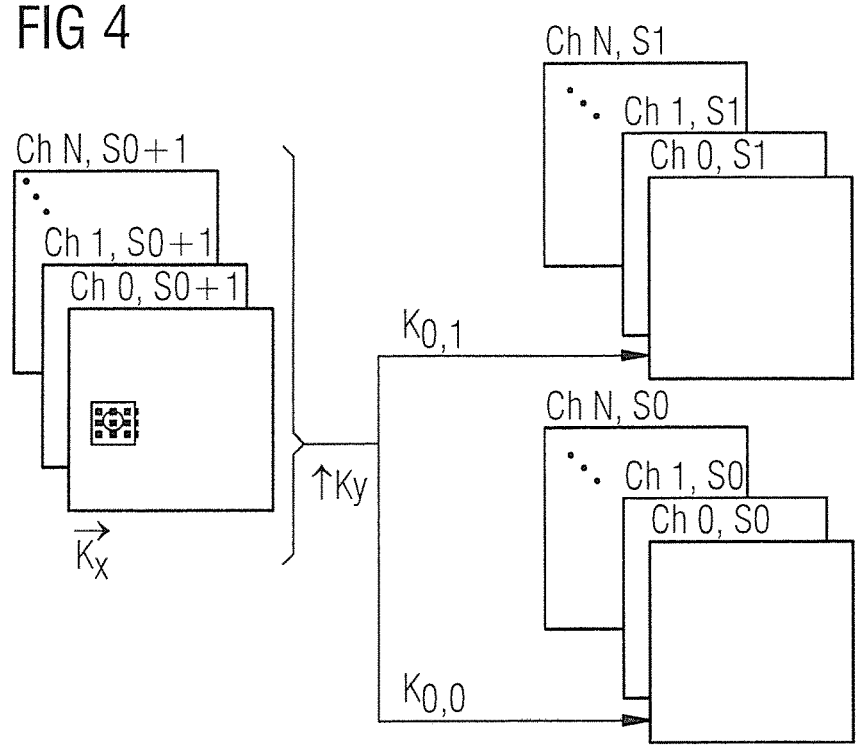
FIG. 4 illustrates the use of the convolution kernels shown in FIG. 3 for the separation of simultaneously measured k-space-raw data.

In FIG. 3, "Ch n, S0" identify measured frequency data for the n-th coil element of the slice S0 of the sequential measurement. This image information (raw data in the k-space) is combined in a convolution matrix (M0+M1) representing the simultaneously measured data. Subsequently, it is necessary to determine a convolution kernel $K_{i,j}$ for each slice j to be separated, wherein this convolution is able to extract the image information $I_{i,j}$ (raw data) of the i-th coil element from the convolution matrix (M0+M1). As can be seen in FIG. 3, raw data measured from the slices S0 and S1 is, for example, measured sequentially from the coil 0, phase-shifted and combined to form the convolution matrices M0 and M1 and this combination M0+M1 compared with the raw data measured sequentially from the slices S0 and S1 $I_{0,0}$ ($I_{0,0}$ not shown) and $I_{0,1}$. This produces the convolution kernels $K_{0,0}$ ($K_{0,0}$ not shown) or $K_{0,1}$.

Therefore, raw data are recorded from a number of single slices and a combined signal generated that corresponds to the measured signal from an accelerated measurement. The generated multi-slice data obtained and the image information $I_{i,j}$ known from the sequential measurements are used to calculate convolution kernels $K_{i,j}$, which can be applied to the accelerated imaging in order to separate the measured raw data again according to slices and coils.

In other words, within the context of the image acquisition by the SMS-accelerated MR sequence, the convolution kernels $K_{i,j}$ determined in this way are used in order to break down the simultaneously measured information into the information assigned to the individual slices. This process is illustrated in FIG. 4. To calculate a data point in the raw-data slice S0 of the coil element Ch0, the measured raw data of the simultaneously measured slices S0+S1 or all the coil elements 0 to N is weighted with the associated kernels $K_{i,j}$ in each case (wherein i=0, . . . number of coil elements, j=0, 1, . . . number of simultaneously read-out slices).

In some circumstances, the method illustrated in FIG. 2 requires the adaptation of the calculation of these convolution kernels. For example, it is conceivable that specific convolution kernels have to be calculated for permutations of the imaging parameters (for example flip angle) and slice sequence. If, for example, a slice S1 is measured with imaging parameters P1 and a slice S2 is measured with parameters P2, there may be a requirement for a separate kernel compared to the acquisition of the slice S1 with parameters P2 and to the acquisition of the slice S2 with parameters P1. For higher acceleration factors, this concept should be expanded analogously for all permutations of imaging parameters. However, the need for specific convolution kernels is determined according to the differentiation of the image content and cannot have a universal answer; instead, it should be checked specifically for each use. In the ideal case, convolution kernels can be used symmetrically, i.e. jointly for all slice-contrast permutations so that no additional reference data has to be recorded. Although a reference measurement of this kind entails a certain time investment, in particular time series of image data are recorded with the SMS technique and so the time advantage resulting from the actual simultaneous imaging greatly exceeds the amount of time initially invested.

The reference data can also be recorded with a dedicated, fast measurement, possibly with a different contrast. As mentioned above, the protocol parameters do not have to be identical. On the contrary, it is possible to select suitable sequences that can be acquired quickly and have advantageous properties (for example are robust with respect to movement). This procedure is described in Bhat et al., ISMRM 22 (2014) (ISMRM=International Society for Magnetic Resonance in Medicine).

Figure 5:
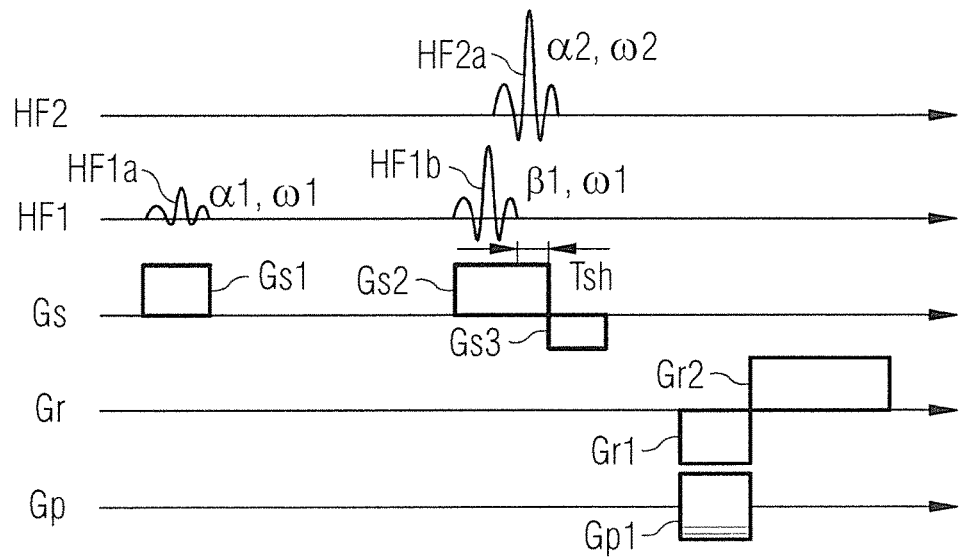
FIG. 5 shows a pulse sequence diagram illustrating an SMS pulse sequence according to a second exemplary embodiment of the invention.

FIG. 5 is a pulse sequence diagram illustrating an SMS pulse sequence according to a second exemplary embodiment of the invention. Unlike the case with the first exemplary embodiment, the second exemplary embodiment uses pulse sequences with a different sequence type for different simultaneously excited slices. Therefore, there is simultaneously an acquisition of a first slice with a first pulse sequence, for example with a spin-echo sequence, and the acquisition of a second slice with a second sequence, in the specific case shown—a gradient-echo sequence. To this end, a first slice is excited by a first excitation pulse HF1$a$ with a first flip angle $\alpha_1$ and a frequency offset $\omega_1$. Part of the spin-echo sequence with which the first slice is excited is also a refocusing pulse HF1$b$ with a flip angle $\beta_1$ and the same frequency offset $\omega_1$ as that of the first excitation pulse HF1$a$. The frequency offset of the refocusing pulse HF1$b$ then only has to be same as that of the first excitation pulse HF1$a$ even if the amplitudes of the slice-selection gradient assigned in each case are the same. The associated slice-selection gradients can generally have different amplitudes and hence the frequencies of the first excitation pulse HF1$a$ and the refocusing pulse HF1$b$ can be different. The refocusing pulse HF1$b$ refocuses the spins excited in the first slice with the aid of the first excitation pulse HF1$a$. Furthermore, within the context of the simultaneous imaging method, a second slice with a second excitation pulse HF2$a$ is excited with a flip angle $\alpha_2$ and a frequency offset $\omega_2$, which in each case differ from the flip angle $\alpha_1$ or the frequency offset $\omega_1$ of the first excitation pulse HF1$a$ applied to the first slice and refocusing pulse HF1$b$. For the slice selection, a slice selection gradient Gs1 is activated simultaneously with the first excitation pulse HF1$a$. In addition, a slice selection gradient Gs2 and then a rephasing gradient Gs3 are played-in in the z-direction. The gradient Gs2 serves both as a slice selection gradient of the refocusing pulse HF1$b$ of the spin-echo sequence and a slice selection gradient of the excitation pulse HF2$a$ of the gradient-echo sequence. The gradients Gr1, Gr2 and Gp1 are then used, as with the imaging procedure in FIG. 2, to sample the k-space for the two slices to be depicted simultaneously.

With this combination of simultaneously excited spin and gradient echoes, it is necessary to set the gradient pulses effective for both slices carefully. The following conditions have to apply for both the echo paths:
  (with phase-encoding of the center line, i.e. Gp1=0), the effective gradient moment must disappear at the echo time (middle of Gr2).
  simultaneously, before using the refocusing pulse HF1$b$, a gradient moment different from zero must be present for the spin-echo path.

This is achieved, for example, with the sequence depicted in FIG. 5. In this case, up to the center of the second excitation pulse HF2$a$, all the gradients act only on the spin-echo path and all subsequent gradients act in the same way on both echo paths.

In this example, readout and phase-encoding gradients are exclusively applied after the second excitation pulse HF2$a$ and hence act on both echo paths. The gradient pulses Gs1, Gs2, Gs3 are applied along slice axis such that the above-named conditions are satisfied. The gradient-echo path is only exposed to the slice-gradient pulses Gs2 (from the center of excitation pulse HF2$a$) and Gs3. The amplitude and duration of Gs3 is selected such that the relevant component of Gs2 for the gradient-echo path is compensated.

If the refocusing pulse HF1$b$ of the spin echo (line HF1) were to be applied simultaneously with the excitation pulse HF2$a$ of the gradient-echo sequence (line HF2), the effective slice-gradient moment after the center of the refocusing pulse HF1$b$ would have to be selected as equal to zero.

Accordingly, it would also be necessary to set a slice moment of zero before the refocusing pulse HF1$b$, but this would be contrary to the second condition, which precisely requires a gradient moment different from zero to be available before the use of the refocusing pulse HF1$b$. For this reason, the refocusing pulse HF1$b$ is applied with a time offset and this simultaneously represents a further advantage with respect to the RF peak power required. For example, the refocusing pulse HF1$b$ can be chronologically shifted forward far enough to ensure that the following applies:

$$Gs1 \cdot \frac{T(HF1a,\ \alpha_1)}{2} - Gs2 \cdot Tshift + Gs3 \cdot T(Gs3) = 0 \qquad (2)$$

In this case, T(HF1$a$, $\alpha_1$) is the duration of the first excitation pulse HF1$a$, Tshift is the shift time with which the refocusing pulse HF1$b$ is shifted relative to the second excitation pulse HF2$a$ and T(Gs3) is the duration of the third gradient Gs3 in the slice direction.

Greater shifts can be achieved in that, for example, simultaneously the first gradient Gs1 in the slice direction is prolonged for the duration of the first excitation pulse HF1$a$ or simultaneously the second gradient Gs2 in the slice direction already starts before the start of the refocusing pulse HF1$b$.

In addition to the simultaneous acquisition of different contrasts, a further central advantage can be identified in that that the suggested technique can be applied with spin-echo sequences for which acceleration by simultaneous multi-slice is only possible to a very restricted degree. Here, the decisive limiting factor is the simultaneous use of the 180° pulse (RF refocusing pulse) on a number of slices for the generation of the spin echo. The reason for this is the exceeding of the maximum permissible value for the SAR input by the constructive superimposition of the 180° pulses. This problem is precisely avoided by means of the procedure described in connection with FIG. 5 with which a temporally offset radiation of the excitation pulse of the gradient-echo sequence and of the 180° pulse, i.e. the RF refocusing pulse of the spin-echo sequence, is performed since simultaneous refocusing of the slices adjacent to the magnetization is avoided.

Figure 6:
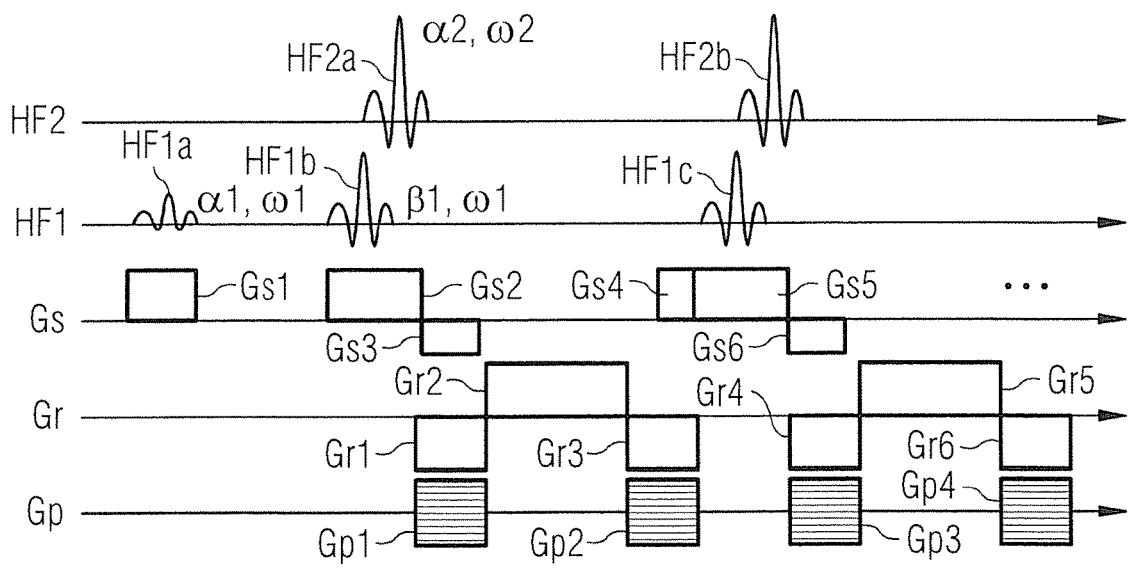
FIG. 6 shows a pulse sequence diagram illustrating an SMS pulse sequence according to a third exemplary embodiment of the invention.

FIG. 6 is a pulse sequence diagram illustrating an SMS pulse sequence with a sequence combination according to a third exemplary embodiment, wherein simultaneously a turbo-spin echo is recorded in a first slice (slice 1, corresponding to line HF1) and a gradient echo is recorded in a second slice (slice 2, corresponding to line HF2). In this case, readout and phase-encoding gradients Gr1, Gr2, Gp1 are identical for both signal paths, i.e. the images are implicitly registered to one another. Until the recording of the first echo, this corresponds to the above depiction in FIG. 5. The read-out gradients Gr1, Gr2 and the phase-encoding gradient Gp1 are rephased following the first data recording by the gradients Gr3 and Gp2. Before each further refocusing pulse HF1$c$, it is necessary to apply an additional gradient Gs4 with the moment Gs1*T(HF1, $\alpha_1$)/2 in order to take account of the additional slice-gradient moment by means of pulse shifting and a rephasing gradient. This is followed by the repeat triggering of a gradient echo with the aid of a second refocusing pulse HF1$c$ and a RF excitation pulse HF2$b$ slightly offset thereto and hence synchronized gradient pulses Gs3, Gs5 in the slice direction. The phase-encoding and readout process of the second echo signals now takes place by means of the gradients Gr4, Gr5, Gp3.

Following the second data recording, the read-out gradients Gr4, Gr5 and the phase encoding gradient Gp3 are rephased by the gradients Gr6 and Gp4.

Figure 7:
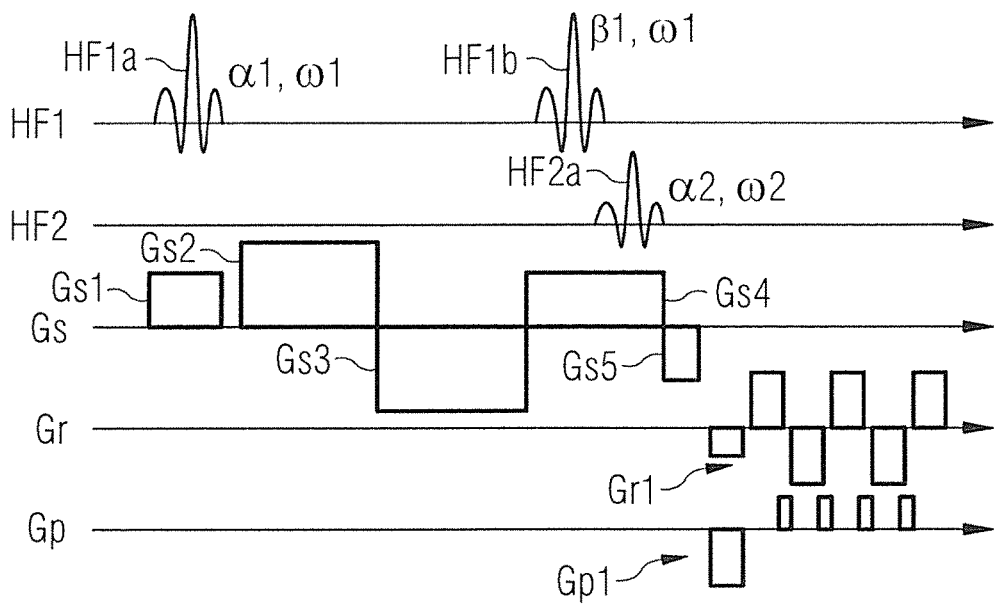
FIG. 7 is a pulse sequence diagram illustrating an SMS pulse sequence according to a fourth exemplary embodiment of the invention.

The diagram in FIG. 7 shows a use according to a fourth exemplary embodiment for the simultaneous acquisition of a diffusion sequence, in the specific case shown here, an echo-planar spin-echo sequence, and a functional imaging sequence, in this case an echo-planar gradient-echo sequence, which is used with functional magnetic resonance tomography (fMRI=functional magnetic resonance imaging). Functional magnetic resonance tomography enables the visualization of blood-flow variations in areas of the brain attributable to metabolic processes associated with neuronal activity. This method makes use of the different properties of oxygenated blood and deoxygenated blood. These different properties are also known as BOLD contrast.

In addition to the marked reduction in the measuring time, the use of the pulse sequence shown in FIG. 7 has the decisive advantage that the brain activity detected by functional magnetic resonance tomography with the simultaneous acquisition of the diffusions-contrast is congruent therewith. Complicated and error-prone co-registration is hence avoidable or greatly simplified. As in the case with the third embodiment illustrated in FIG. 6, in the fourth embodiment shown in FIG. 7, the gradients in the slice direction Gs1, Gs2, Gs3, Gs4, Gs5 are also arranged such that the two conditions discussed with respect to the second exemplary embodiment are satisfied. While the gradient Gs1 is a slice-selection gradient, the two gradients Gs2 and Gs3 are diffusion-encoding gradients. This does not mandatorily have to be applied in the slice direction. For example, during the measurement, successive diffusion gradients with different directions and amplitudes can be activated in order to obtain information on the amplitude and the direction of the mobility of the molecules in the region to be depicted. Neither do the diffusion gradients mandatorily have to be applied successively applied as shown in FIG. 7—there may also be a time interval between them. It is also possible for more than two diffusion gradients to be activated as long as a dissipating gradient moment is obtained overall.

FIG. 7 shows an example with which diffusion-encoding gradients Gs2, Gs3 are only applied before the refocusing pulse HF1$b$. If the spin-echo refocusing pulse HF1$b$ and the gradient-echo-excitation pulse HF2$a$ are completely separate in terms of time (see the above explanation of the prolongation of $T_{shift}$), diffusion gradients can also be distributed between the times before and after the refocusing pulse. The frequency-encoding gradient Gr1 and phase-encoding gradient Gp1 used jointly for the two echo-planar sequences enable a plurality of echo signals to be read-out following a single excitation or, in this case, two simultaneous excitations.

Figure 8:
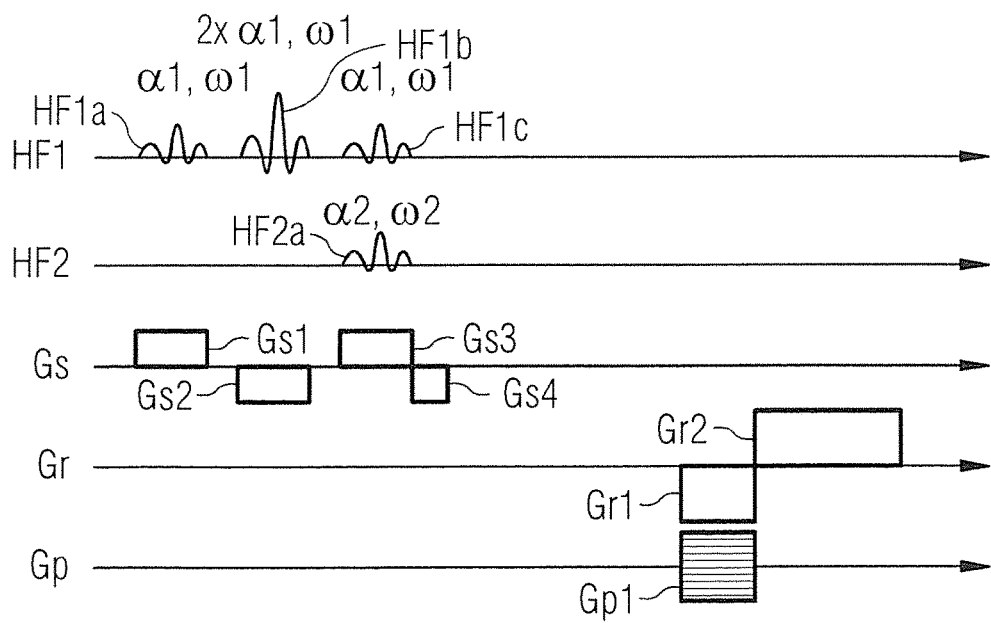
FIG. 8 is a pulse sequence diagram illustrating an SMS pulse sequence according to a fifth exemplary embodiment of the invention.

FIG. 8 is a pulse sequence diagram illustrating an SMS pulse sequence according to a fifth exemplary embodiment of the invention. In this case, one of the two slices is excited in a chemically selective manner, for example by the use of a binomial pulse. A binomial pulse should be understood to mean a pulse sequence of a plurality of partial excitation pulses HF1$a$, HF1$b$, HF1$c$. The term is derived from the amplitude ratios of the individual pulses. For example, amplitude ratios 1-1, 1-2-1 or 1-3-3-1 corresponding to the binomial coefficients are possible. With excitation of this kind, initially a first RF partial excitation pulse HF1$a$ with a first flip angle $\alpha_1$ and a first frequency offset $\omega_1$ is activated for a first slice (see line 1, identified as HF1). Then a second RF partial excitation pulse HF1$b$ with double the flip angle $2\alpha_1$ and the same frequency offset $\omega_1$ further excites the magnetization in this slice that has developed in the interim in response to the chemical shift. Following a further development time, a third RF partial excitation pulse HF1$c$ with the flip angle $\alpha_1$ and the first frequency offset $\omega_1$ is activated for the first slice. Simultaneously to the respective RF pulses HF1$a$, HF1$b$, HF1$c$, gradient pulses Gs1, Gs2, Gs3 are also activated in the slice direction and serve to select a slice stack to be excited. Simultaneously to the third RF partial excitation pulse HF1$c$ for the first slice, a RF excitation pulse HF2$a$ with a second flip angle $\alpha_2$ and a second frequency offset $\alpha_2$ of the second slice is activated. The second slice (see second line HF2) is excited with a gradient-echo sequence. During this, the third slice selection gradient Gs3 already used for the slice selection of the third RF partial excitation pulse HF1$c$ of the first slice is also used for the slice selection of the RF excitation pulse HF2$a$ of the second slice. In addition, a fourth gradient Gs4 is then activated in the slice direction for the rephasing of the magnetization in both slices. The excitation of the spins of the different molecules is briefly interrupted between the partial excitation pulses in order to permit a desired phase evolution of the second spin species precessing with another frequency. Since different proton binding states are present in different molecules, the protons have different precession frequencies in different molecules and can hence be excited selectively with RF excitation pulses with different frequency offsets $\omega_1$, $\omega_2$. As usual, the phase-encoding and the readout process are performed using the gradients Gp1, Gr1, Gr2.

Figure 9:
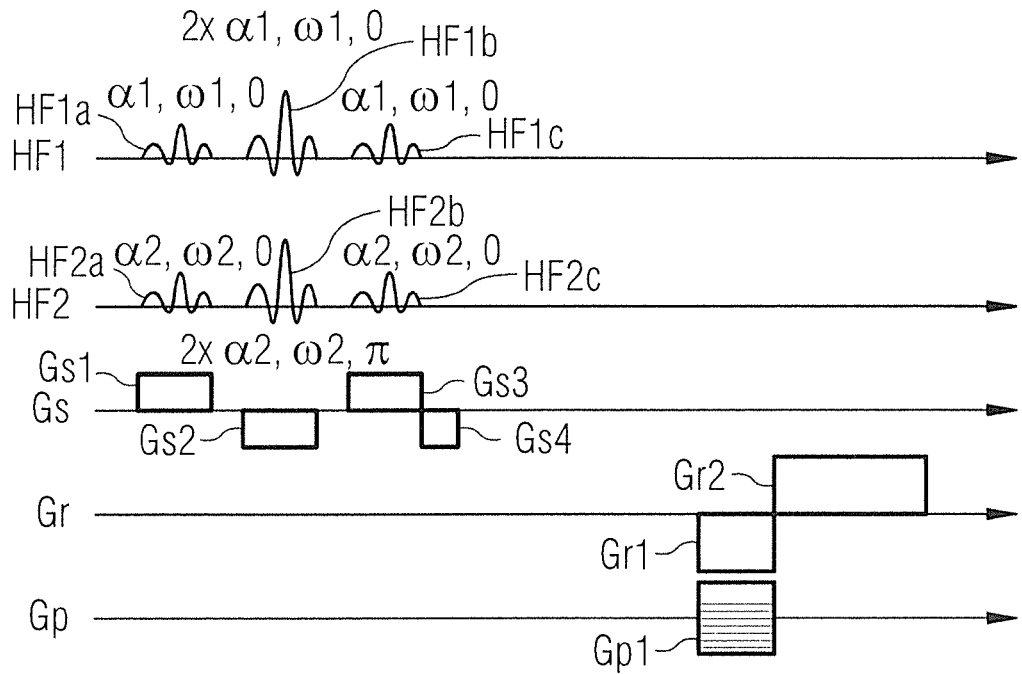
FIG. 9 is a pulse sequence diagram illustrating an SMS pulse sequence according to a sixth exemplary embodiment of the invention.

FIG. 9 is a pulse sequence diagram illustrating an SMS pulse sequence according to a sixth exemplary embodiment of the invention. Here, unlike the fifth exemplary embodiment shown in FIG. 8, in the sixth exemplary embodiment different spin species are excited in a chemically selective manner in both slices. When using binomial pulses, this is achieved for example by inverting the phase of each second RF partial excitation pulse HF2$b$. In the special case that hydrogen nuclei of the fat molecules are excited in one of the slices and hydrogen nuclei of the water molecules are excited in the other slice excited, in the slice with excitation of the nuclei of the fat-bound hydrogen atoms there is no presaturation of the water-bound component. With excitation of this kind, initially a first RF partial excitation pulse HF1$a$ with a first flip angle $\alpha_1$ and a first frequency offset $\omega_1$ is activated for a first slice (see line 1, designated HF1). This is followed by a short pause in which a desired phase evolution between a first spin-species and a second spin species of a second type of molecule precessing with another frequency, for example water molecules, is enabled. Then, a second RF partial excitation pulse HF1$b$ with double the flip angle $2\alpha_1$ and the same frequency offset $\omega_1$ further excite the magnetization that has developed in this slice. Following a further development time, a third RF partial excitation pulse HF1$c$ with the flip angle $\alpha_1$ and the first frequency offset $\omega_1$ is activated for the first slice. Simultaneously to the respective RF pulses HF1$a$, HF1$b$, HF1$c$ of the first slice, gradient pulses Gs1, Gs2, Gs3 are also activated in the slice direction and serve to select a slice stack to be excited of which the first slice is a component. Simultaneously to the first RF partial excitation pulse HF1$a$ for the first slice, a first RF partial excitation pulse HF2$a$ with a second flip angle $\alpha_2$ and a second frequency offset $\omega_2$ and a phase with the value 0 is also activated for the second slice. Subsequently or simultaneously to the second RF partial excitation pulse HF1$b$ of the first slice, a second RF partial excitation pulse HF2$b$ is also activated for the second slice. Compared to the first RF partial excitation pulse HF2$a$, the second RF partial excitation pulse HF2b for the second slice has double the flip angle $2\alpha_2$ and the same frequency offset $\omega_2$, but a phase that differs by 180°. Subsequently, simultaneously to the third RF partial excitation pulse HF1c for the first slice, a third RF partial excitation pulse HF2c with the same flip angle $\alpha_2$ and the same frequency offset $\omega_2$ and the same phase with the value 0 as the first RF partial excitation pulse HF2a for the second slice is activated for the second slice. In both slices, the slice-stack selection is performed with the same gradient pulses Gs1, Gs2, Gs3. Following the playing-out of the binomial pulses, a rephasing gradient Gs4 is also switched in the slice direction. The phase-encoding and the readout process are, as usual, performed using the gradients Gp1, Gr1, Gr2.

Figure 10:
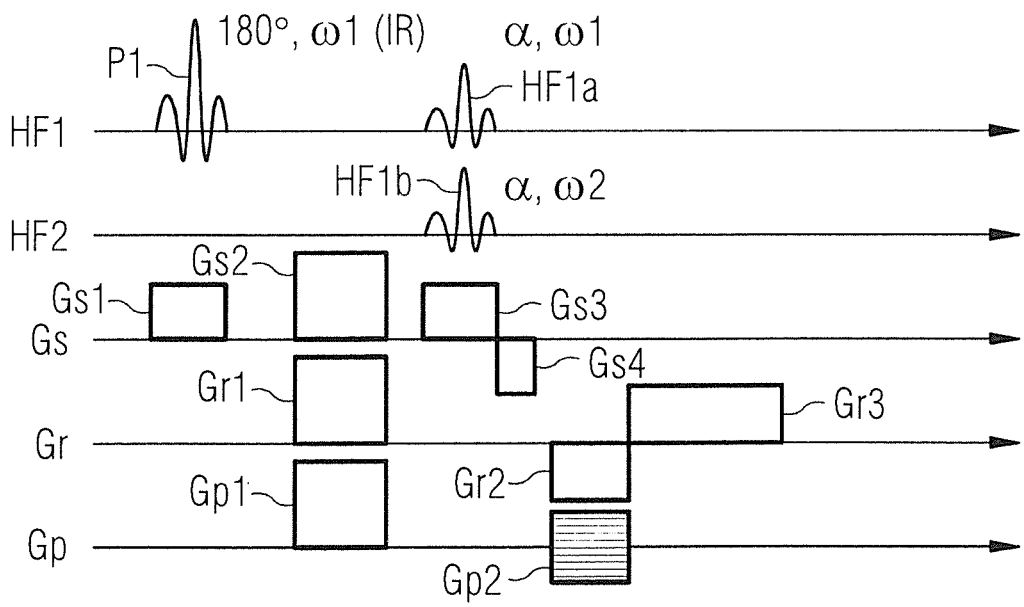
FIG. 10 is a pulse sequence diagram illustrating an SMS pulse sequence according to a seventh exemplary embodiment of the invention.

FIG. 10 is a pulse sequence diagram illustrating an SMS pulse sequence according to a seventh exemplary embodiment of the invention. In this case, slice-dependent contrast preparations—for example an inversion, saturation or T2 preparation—are only used for one of the two slices. To this end, a first RF preparation pulse P1 with a flip angle of 180° and a frequency offset $\omega_1$ is activated for the preparation of the contrast of a first slice (see first line HF1). Simultaneously thereto, a first slice selection gradient Gs1 is activated. Then, spoiler pulses Gs2, Gr1 and Gp1 are activated in all directions, i.e., in the slice selection direction, in the frequency-encoding direction and in the phase-encoding direction, as gradient pulses. Next, simultaneously RF excitation pulses HF1a, HF2a of the two slices with the same flip angle but different frequency offsets $\omega 1$, $\omega 2$ are activated for different slices. In this special case, these RF excitation pulses are part of a gradient-echo sequence. Therefore, a gradient pulse Gs3 activated simultaneously with the RF excitation pulses HF1a, HF2a in the slice direction is followed by a further rephasing pulse Gs4, which also acts on both slices. Finally, a readout process takes place in the usual manner using gradients Gr2, Gr3 in the frequency-encoding direction and a gradient Gp2 in the phase-encoding direction.

Figure 11:
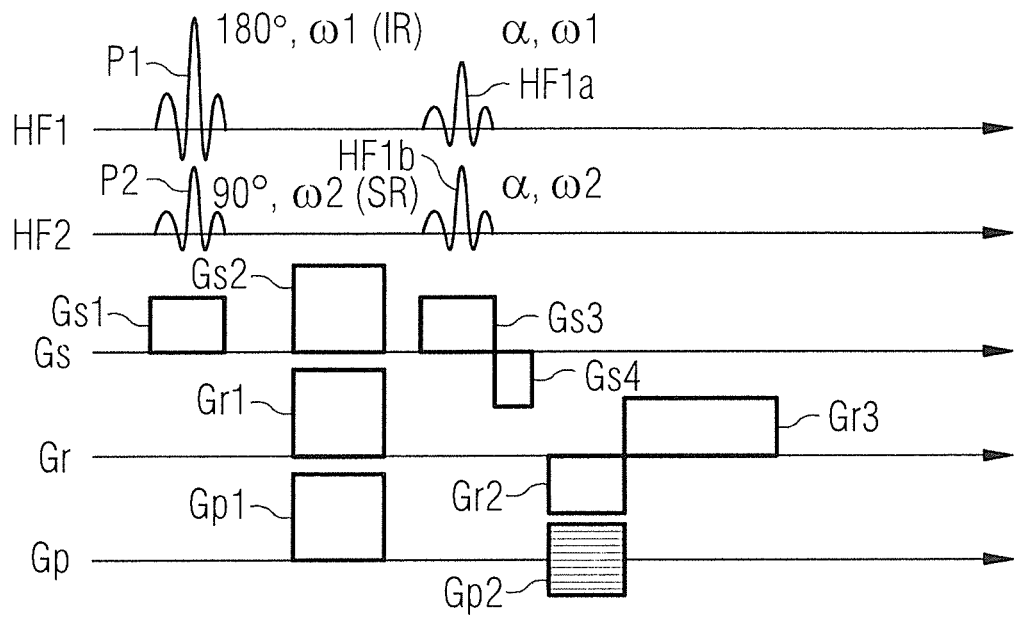
FIG. 11 is a pulse sequence diagram illustrating an SMS pulse sequence according to an eighth exemplary embodiment of the invention.

FIG. 11 is a pulse sequence diagram illustrating an SMS pulse sequence according to an eighth exemplary embodiment of the invention. In this case, different slice-dependent contrast preparations are used for both slices. The structure of the pulse sequence according to the eighth exemplary embodiment substantially corresponds to the structure of the pulse sequence according to the seventh exemplary embodiment apart from the fact that that, simultaneously to the preparation pulse P1 of the first slice, a preparation pulse P2 of the second slice is activated. This second preparation pulse P2 comprises a flip angle of 90° and a frequency offset $\omega_2$ different from the frequency offset $\omega_1$ of the first preparation pulse P1. This enables different preparations to be used in different slices and correspondingly different contrasts to be acquired simultaneously.

Figure 12:
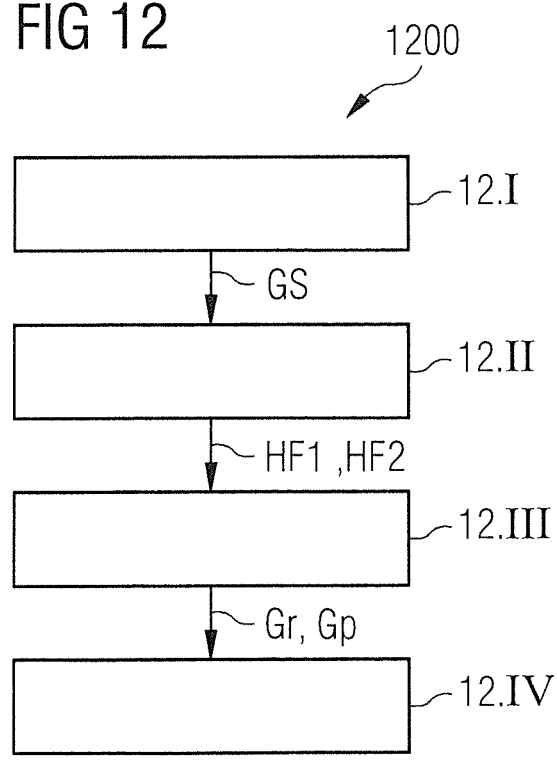
FIG. 12 is a flowchart illustrating a method according to an exemplary embodiment of the invention.

FIG. 12 is a flowchart illustrating a method according to an exemplary embodiment of the invention. With the method for the actuation of a magnetic resonance imaging system, a pulse sequence is generated, wherein initially in the scope of an excitation process, in step 12.I a slice selection gradient pulse GS is generated in the slice selection direction. In step 12.II, different transverse magnetizations are generated by the generation of RF excitation pulses HF1, HF2 for the excitation of 2 slices to be simultaneously excited in this special exemplary embodiment such that the magnetization state of the 2 simultaneously excited slices differs with respect to a further imaging parameter that does not relate to the excitation frequency, in this case the flip angle $\alpha$. During a subsequent readout process, in step 12.III, one or more common readout and phase-encoding gradient pulses Gr, Gp are generated for the 2 simultaneously excited slices. Finally, in step 12.IV RF signals are acquired for the acquisition of magnetic resonance raw data.

Figure 13:
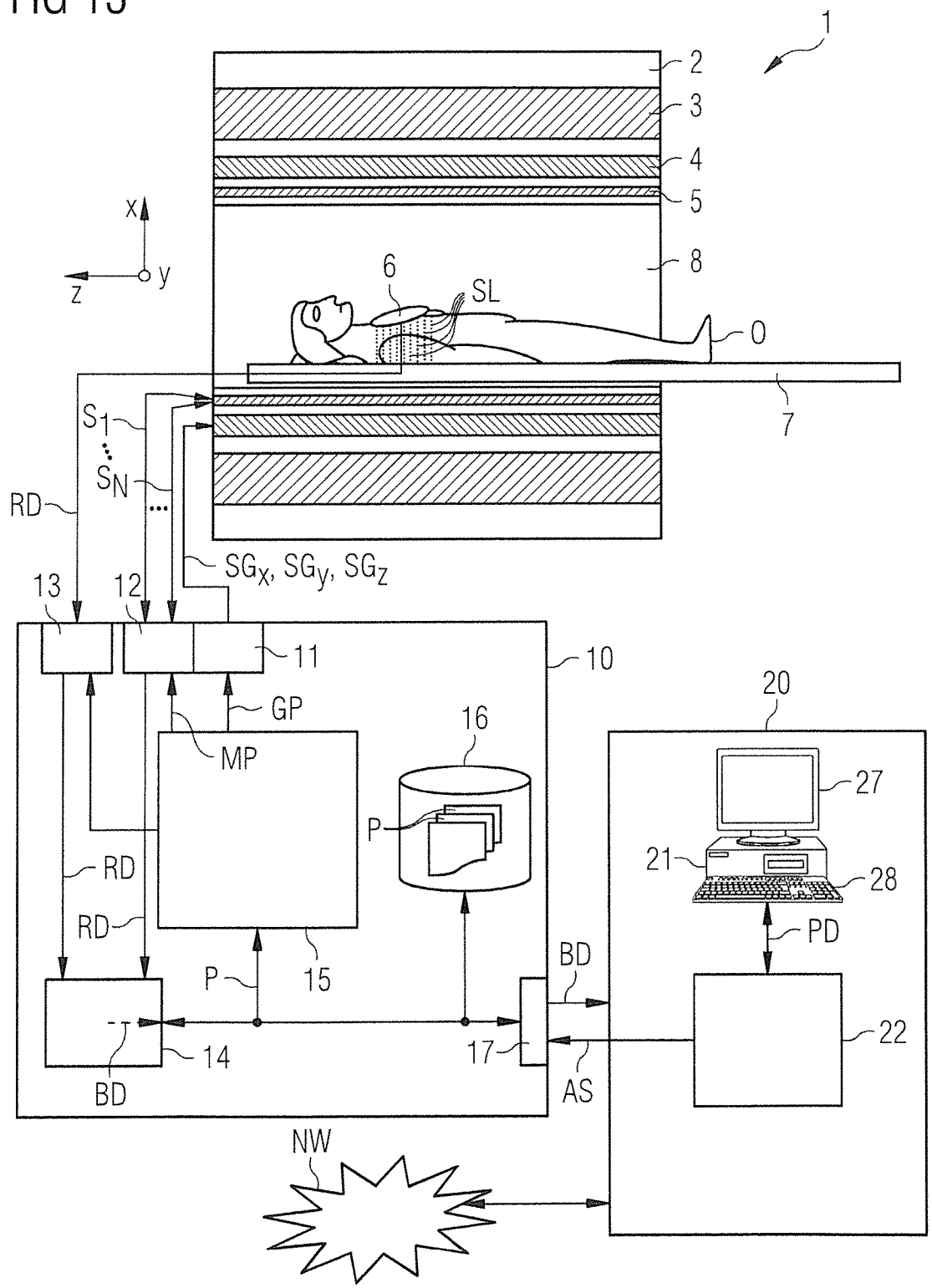
FIG. 13 schematically illustrates a magnetic resonance system according to the invention.

FIG. 13 is a schematic depiction of a magnetic resonance system or a magnetic resonance imaging system 1 according to the invention. The system includes the actual magnetic resonance scanner 2 with a measurement chamber 8 or patient tunnel located therein. A bed 7 can be introduced into this patient tunnel 8 such that an object under examination O (for example a patient/test subject or a material to be examined) lying thereupon can be supported at a specific position during an examination within the magnetic resonance scanner 2 relative to the magnetic system and radio-frequency system arranged therein, or can be moved between different positions during a measurement.

Basic components of the magnetic resonance scanner 2 are: a basic field magnet 3, a gradient system 4 with gradient coils in order to apply arbitrary magnetic field gradients in the x-, y- and z-directions and a whole-body radio-frequency coil 5.

Alternatively or additionally, it is also possible for local transmit coils to be used for the excitation of magnetic resonance signals, as is frequently the case with knee imaging, for example.

The reception of magnetic resonance signals induced in the object under examination O can take place via the whole-body unit 5 with which, as a rule, the radio-frequency signals for inducing the magnetic resonance signals are also emitted. However, usually, these signals are received with local coils 6 placed on or under the object under examination O, for example. All these components are known in principle to those skilled in the art and are therefore only shown schematically in FIG. 5.

The whole-body radio-frequency coil 5 in the example of a birdcage antenna, has a number N of individual antenna rods that are separately controllable as individual transmission channels S1, . . . , SN by a control computer 10, i.e. the magnetic resonance tomography system 1 is a pTX-capable system. However, it is noted that the method according to the invention is also applicable to conventional magnetic resonance tomography devices with only one transmission channel.

The control computer 10 can be composed of a number of individual computers or processors—which may optionally also be spatially separate and connected to one another via suitable bus systems or cables or the like. This control computer 10 is connected via a terminal interface 17 to a terminal 20 via which an operator can control the entire system 1. In the present case, this terminal 20 has a computer 21 with a keyboard 28, one or more screens 27 and further input devices such as, for example a mouse or the like, so that a graphical user interface is provided to the operator.

The control computer 10 includes inter alia, a gradient controller 11 that can be composed of multiple sub-components. The individual gradient coils are provided with control signals SGx, SGy, SGz via this gradient controller 11. These control signals are gradient pulses that, during a measurement, are set at precisely provided time positions and with a precisely prespecified time curve in order to sample the object under examination O and the associated k-space preferably in individual slices SL according to an actuation sequence AS.

The control computer 10 also includes an RF transceiver unit 12. This RF transceiver unit 12 is also composed of multiple sub-components in order to in each case feed radio-frequency pulses separately and in parallel to the individual transmission channels S1, ... SN, i.e. in this case to the individually controllable antenna rods of the body coil 5. Magnet-resonance signals can also be received via the transceiver unit 12. However, in this exemplary embodiment, this takes place with the use of the local coils 6. The raw data RD received by these local coils 6 are read-out and processed by an RF reception unit 13. The magnetic resonance signals received thereby or by the whole-body unit 5 by means of the RF transceiver unit 12 are transferred as raw data RD to a reconstruction unit 14, which reconstructs the image data BD therefrom and stores the image data BD in a memory 16 and/or transfers the image data BD to the terminal 20 via the interface 17 so that the user can view the image represented thereby. The image data BD can also be stored and/or displayed at other points via a network NW. If the local coils 6 have a suitable switching unit, they can also be connected to an RF transceiver unit 12 in order also to use the local coils to transmit, in particular in pTX mode.

The gradient controller 11, the RF transceiver unit 12 and the reception unit 13 for the local coils 6 are each actuated in a coordinated manner by a sequence controller 15. This ensures, by corresponding commands, that a desired gradient pulse train GP is emitted by suitable gradient control signals SGx, SGy, SGz and controls the RF transceiver unit 12 in parallel so that a multi-channel-pulse train MP is emitted, i.e. the matching radio-frequency pulses are transferred to the individual transmit rods of the whole-body unit 5 in parallel on the individual transmission channels S1, ... SN. Moreover, it is necessary to ensure that the magnetic resonance signals are read out at the local coils 6 by the RF reception unit 13 or any possible signals are read out at whole-body unit 5 by means of the RF transceiver unit 12 at the appropriate time and further processed. The sequence controller 15 transfers the corresponding signals, in particular the multi-channel-pulse train MP to the radio-frequency transceiver unit 12 and the gradient pulse train GP to the gradient controller 11, according to a prespecified control protocol P. All control data that has to be set during a measurement according to a prespecified actuation sequence AS is stored in this control protocol P.

Usually, a number of control protocols P for different measurements are stored in a memory 16. The user can select these via the terminal 20 and optionally vary them in order then to provide a suitable control protocol P for the currently desired measurement with which the measurement control unit 15 can operate. Furthermore, the user can retrieve control protocols P, for example from a manufacturer of the magnetic resonance system, via a network NW, and then modify and use said protocols as necessary.

However, the basic workflow of magnetic resonance measurement of this kind and the cited components for actuation are known to those skilled in the art and thus need not be discussed in further detail herein. In addition, a magnetic resonance scanner 2 of this kind and the associated control arrangement can have further components, which likewise need not be explained in detail herein. The magnetic resonance scanner 2 can be of a different design, for example with a patient chamber open to the side, and the radio-frequency whole-body coil does not have to be designed as a birdcage antenna.

FIG. 13 is a schematic depiction of a control-sequence-determining computer 22 according to the invention that serves to determine a magnetic resonance-system actuation sequence AS. This magnetic resonance-system-actuation sequence AS includes inter alia a pulse sequence with a pulse train GP for a specific measurement in order to proceed through a specific trajectory in the k-space and a radio-frequency-pulse train coordinated thereto, in this case a multi-channel-pulse train MP for the actuation of the individual transmission channels 1, ... , SN. In the present case, the magnetic resonance-system-actuation sequence AS is created on the basis of parameters PD specified in the measurement protocol P, in particular in accordance with a method described with respect to FIGS. 2, 5 to 11. In this case, the control-sequence-determining processor 22 can be contained in the magnetic resonance system 1 and be a component of the terminal 20 (see FIG. 13) or in particular also a component of the control computer 10. However, the control-sequence-determining processor 22 can also be provided externally as an independent unit and designed for use with a number of different magnetic resonance systems.

It is apparent from the above descriptions that the invention efficiently provides possibilities for improving a method for the actuation of a magnetic resonance imaging system for the generation of magnetic resonance image data with respect to speed, flexibility and image quality.

The features of all the exemplary embodiments or in developments disclosed in the figures can be used in any combination.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance data, comprising:
    operating a magnetic resonance data acquisition scanner, while an object is situated therein, to implement a scan in which magnetic resonance raw data are acquired from the object, by simultaneously exciting different transverse magnetizations of nuclear spins respectively in a different slice in a plurality N slices of the object, with said different transverse magnetizations being simultaneously present in an entirety of each excited slice at least one time interval of said scan;
    entering said magnetic resonance raw data for the entirety of each slice into an electronic memory at respective data entry points in said memory, as k-space data, said k-space data for the respective slices representing respectively different contrasts for the slices, due to said different magnetizations; and
    from a processor having access to said electronic memory, making said k-space data available in electronic form as a data file.

2. A method as claimed in claim 1 comprising operating said magnetic resonance data acquisition scanner to implement said scan in a data acquisition pulse sequence comprising:
    an excitation process and a subsequent readout process;
    in said excitation process, activating a slice selection gradient pulse in a slice selection direction, generating said different transverse magnetizations by radiating at least one RF excitation pulse that simultaneously influences said nuclear spins in said N slices, with said at least one RF excitation pulse causing the magnetization of the nuclear spins in said N slices to be simultaneously influenced by a further imaging parameter unrelated to an excitation frequency and unrelated to an excitation phase; and
    in said readout process, generating at least one common readout gradient pulse for said N slices that are simultaneously influenced by radiation of said at least one RF excitation pulse, and receiving magnetic resonance signals from said N slices representing said magnetic resonance raw data.

3. A method as claimed in claim 2 comprising selecting said further imaging parameter from the group consisting of an amplitude value of said at least one RF excitation pulse, an amplitude curve of said at least one RF excitation pulse, a number of RF excitation pulses, a starting point and a duration of said at least one RF excitation pulse, and a sequence type of said data acquisition pulse sequence.

4. A method as claimed in claim 2 comprising selecting said further imaging parameter to be different for at least some of said N slices, in order to generate excitations of said nuclear spins with different flip angles in said at least some of said N slices.

5. A method as claimed in claim 1 comprising exciting said nuclear spins in at least a portion of said N slices with respectively different magnetic resonance pulse sequences.

6. A method as claimed in claim 5 comprising selecting said different magnetic resonance pulse sequences from the group consisting of spin-echo sequences and gradient-echo sequences.

7. A method as claimed in claim 5 comprising, in said respectively different pulse sequences, permutating assignment of respective positions of slices in said N slices from pulse sequence-to-pulse sequence, to cause said magnetic resonance data to be acquired from an entire volume, composed of all said N slices, to be acquired with different excitations of said nuclear spins therein.

8. A method as claimed in claim 1 comprising, in said processor, implementing a magnetic resonance fingerprinting procedure for different, simultaneously acquired magnetic resonance data for the respective N slices.

9. A method as claimed in claim 1 wherein said magnetic resonance data acquisition scanner comprises a plurality M of RF coils, and wherein said different transverse magnetizations respectively cause different contrasts in an image reconstructed from said magnetic resonance raw data, and wherein said method comprises:
   operating said magnetic resonance data acquisition scanner to implement a reference measurement wherein the nuclear spins in said N slices are excited by said plurality M of RF coils; and
   in said processor, calculating convolution matrices for reconstructing said image from said magnetic resonance raw data using a permutated combination of respective reference measurements, and adapting the calculation of the convolution matrices by calculating a respective convolution kernel for at least some of said permutations of the contrast and the respective positions of the N slices.

10. A method as claimed in claim 1 comprising operating said magnetic resonance data acquisition scanner to excite said nuclear spins in the plurality of N slices by radiating a binomial RF pulse that excites nuclear spins in at least a portion of the N slices in a chemically selective manner.

11. A method as claimed in claim 1 comprising operating said magnetic resonance data acquisition scanner by radiating a plurality of different binomial RF pulses that excite the nuclear spins in different groups of slices among said N slices, differently in a chemically selective manner.

12. A method as claimed in claim 1 comprising operating said magnetic resonance data acquisition scanner to perform a contrast preparation for a portion of said plurality of N slices.

13. A method as claimed in claim 1 comprising operating said magnetic resonance data acquisition scanner to perform respectively different contrast preparations for different groups of slices among said plurality of N slices.

14. A computer configured to determine an actuation sequence for operating a magnetic resonance imaging apparatus, said computer comprising:
   a processor configured to generate a pulse sequence comprising an excitation portion followed by a readout portion;
   said processor being configured to generate said excitation portion to comprise at least one RF excitation pulse that is designed to simultaneously excite different transverse magnetizations of nuclear spins respectively in different slices in a plurality N slices of the object, with said different transverse magnetizations being simultaneously present in an entirety of each excited slice at least one time interval of said scan;
   said processor being configured to generate said readout portion to comprise a readout window for reading out RF signals from the respective entireties of each of said N slices, as raw data; and
   an output interface in communication with said processor configured to make said pulse sequence available from said computer in electronic form as a control signal with a format for operating a magnetic resonance data acquisition scanner.

15. A computer as claimed in claim 14 wherein said processor is configured to:
   generate said excitation portion to comprise a slice selection gradient in a slice selection direction, and design said at least one RF excitation pulse to influence N slices in the examination object simultaneously, to cause the magnetization in at least some of said N slices to be simultaneously influenced by a further imaging parameter unrelated to excitation frequency and unrelated to excitation phase.

16. A magnetic resonance imaging apparatus comprising:
   a magnetic resonance data acquisition scanner;
   a control computer configured to operate the magnetic resonance data acquisition scanner, while an object is situated therein, to implement a scan in which magnetic resonance raw data are acquired from the object, by simultaneously exciting different transverse magnetizations of nuclear spins respectively in a different slice in a plurality N slices of the object, with said different transverse magnetizations being simultaneously present in an entirety of each excited slice at least one time interval of said scan;
   an electronic memory;
   said control computer being configured to enter said magnetic resonance raw data for the entirety of each slice into said electronic memory at respective data entry points in said memory, as k-space data, said k-space data for the respective slices representing respectively different contrasts for the slices, due to said different magnetizations; and
   said control computer being configured to access said electronic memory, and to make said k-space data available in electronic form as a data file.

17. A non-transitory, computer-readable data storage medium encoded with programming instructions, said storage medium being loaded into a control computer of a magnetic resonance imaging apparatus that comprises a magnetic resonance data acquisition scanner, said programming instructions causing said control computer to:
   generate a pulse sequence comprising an excitation portion followed by a readout portion;

generate said excitation portion to comprise at least one RF excitation pulse that is designed to simultaneously excite different transverse magnetizations of nuclear spins respectively in different slices in a plurality N slices of the object, with said different transverse magnetizations being simultaneously present in an entirety of each excited slice at least one time interval of said scan;

generate said readout portion to comprise a readout window for reading out RF signals from the respective entireties of each of said N slices, as raw data; and make said pulse sequence available from said computer in electronic form as a control signal with a format for operating said magnetic resonance data acquisition scanner.

18. A non-transitory, computer-readable data storage medium as claimed in claim 17 wherein said programming instructions cause said control computer to:

generate said excitation portion to comprise a slice selection gradient in a slice selection direction, and to design said at least one RF excitation pulse to influence N slices in the examination object simultaneously, to cause the magnetization in at least some of said N slices to be simultaneously influenced by a further imaging parameter unrelated to excitation frequency and unrelated to excitation phase.

\* \* \* \* \*